(12) United States Patent
Xia et al.

(10) Patent No.: US 7,373,048 B2
(45) Date of Patent: May 13, 2008

(54) POLARIZATION INSENSITIVE SEMICONDUCTOR OPTICAL AMPLIFIER

(75) Inventors: Fengnian Xia, Princeton, NJ (US); Stephen Forrest, Princeton, NJ (US)

(73) Assignee: Trustees of Princeton University, Princeton, NJ (US)

( * ) Notice: Subject to any disclaimer, the term of this patent is extended or adjusted under 35 U.S.C. 154(b) by 327 days.

(21) Appl. No.: 11/062,095

(22) Filed: Feb. 18, 2005

(65) Prior Publication Data

US 2005/0185889 A1 Aug. 25, 2005

Related U.S. Application Data

(60) Provisional application No. 60/545,703, filed on Feb. 18, 2004.

(51) Int. Cl.
*G02B 6/26* (2006.01)
*G02B 6/42* (2006.01)
*G02B 6/10* (2006.01)
*H01S 3/00* (2006.01)
*H01S 3/30* (2006.01)
*H04B 10/12* (2006.01)

(52) U.S. Cl. .................... 385/43; 385/27; 385/28; 385/39; 385/129; 385/130; 385/131; 385/132; 359/341.1; 372/6

(58) Field of Classification Search ............ 385/27, 385/28, 39, 43, 129–132; 359/341.1; 372/6
See application file for complete search history.

(56) References Cited

U.S. PATENT DOCUMENTS 5,033,812 A * 7/1991 Yoshida et al. ............ 385/37

| 6,330,378 | B1 | 12/2001 | Forrest et al. | |
| 6,381,380 | B1 | 4/2002 | Forrest et al. | |
| 6,483,863 | B2 | 11/2002 | Forrest et al. | |
| 2002/0031297 | A1 | 3/2002 | Forrest et al. | |
| 2003/0007719 | A1 | 1/2003 | Forrest et al. | |
| 2004/0062485 | A1 * | 4/2004 | Kelly et al. | ............ 385/50 |

OTHER PUBLICATIONS

Moerman et al. "A Review on Fabrication Technologies for the Monolithic Integration of Tapers with III-V Semiconductor Devices", IEEE Journal of Selected Topics in Quantum Electronics, vol. 3, No. 6, pp. 1308-1320, Dec. 1997.

(Continued)

*Primary Examiner*—Brian Healy
*Assistant Examiner*—Derek L. Dupuis
(74) *Attorney, Agent, or Firm*—Lerner, David, Littenberg, Krumholz & Mentlik, LLP

(57) ABSTRACT

A polarization insensitive semiconductor optical amplifier (SOA) is provided. The SOA includes an active waveguide, a passive waveguide, and a taper coupler for coupling optical energy from the passive waveguide into the active waveguide, wherein the taper coupler has width W varying relative to position along a main axis z of propagation of the SOA in proportion to the minimum value of $1/C_{TE\ 01}(z)$ $1/C_{TM\ 01}(z)$, where $C_{TE\ 01}(z)$ represents the coefficient of energy coupling between a fundamental mode and a first order mode for the transverse electric polarization as a function of the position z, and $C_{TM\ 01}(z)$ represents the coefficient of energy coupling between a fundamental mode and a first order mode for the transverse magnetic polarization as a function of the position z.

32 Claims, 4 Drawing Sheets

OTHER PUBLICATIONS

Silver et al. "Design and ASE Characteristics of 1550-nm Polarization-Insensitive Semiconductor Optical Amplifiers Containing Tensile and Compressive Wells", IEEE Journal of Quantum Electronics, vol. 36, No. 1, pp. 118-122, Jan. 2000.

Xia et al. "An Asymmetric Twin-Waveguide High-Bandwidth Photodiode Using a Lateral Taper Coupler", IEEE Photonics Technology Letters, vol. 13, No. 8, pp. 845-847, Aug. 2001.

Itoh et al. "Polarization-Insensitive SOA With a Strained Bulk Active Layer for Network Device Application", IEEE Photonoics Technology Letters, vol. 14, No. 6, pp. 765-767, Jun. 2002.

Bakke et al. "Polymeric Optical Spot-Size Transformer With Vertical and Lateral Tapers", Journal of Lightwave Technology, vol. 20, No. 7, pp. 1188-1197, Jul. 2002.

* cited by examiner

POLARIZATION INSENSITIVE SEMICONDUCTOR OPTICAL AMPLIFIER

This application claims the benefit of the filing date of U.S. Provisional Patent Application No. 60/545,703 filed Feb. 18, 2004 the disclosure of which is hereby incorporated herein by reference.

BACKGROUND OF THE INVENTION

The present invention relates to semiconductor optical amplifiers.

The efficient transfer of optical energy is a primary design goal of semiconductor optical amplifiers (SOAs). Providing inexpensive fabrication methods is another. However, fabrication methods should be robust, allowing for variations to occur without compromising function and reliability. Polarization insensitive operation is another goal of SOA design. Polarization insensitivity is needed to provide consistent amplification of the optical signal, despite variations that occur in its polarization.

Up to the present time, the pursuit of such goals has been fraught with problems. Good signal coupling from the optical transmission fiber into the active region of the optical amplifier is needed for efficient energy transfer. However, signal coupling loss between the optical fiber and the SOA has been high in prior art SOAs, typically ranging between 5 and 7 dB or even more.

Some prior art processing methods, termed "material regrowth", are intended to improve energy coupling efficiency of SOAs. However, such methods are difficult and costly to perform. In addition, they fail to achieve desired coupling efficiency. In a material regrowth process, the epitaxial layers of the substrate are not grown in a continuous sequence of steps. Instead, the substrate is processed incrementally in a deposition chamber to grow one or more layers, and then removed to a second chamber to perform one or more etch steps. After etching, the substrate is returned to a deposition chamber again for to grow more layers. Later, the substrate may be returned again to the second chamber to be etched.

Some less costly, easier to manufacture alternatives also fail to achieve good coupling efficiency between the optical transmission fiber and the active region of the SOA. Nor have such alternatives been able to provide polarization insensitive operation.

It would be desirable to provide a semiconductor optical amplifier (SOA) that is polarization insensitive and has high energy coupling efficiency between the optical transmission fiber and the SOA and/or between the SOA and an optical transmission fiber. It would further be desirable to provide a method of making an SOA that does not require the growth or regrowth of one or more epitaxial semiconductor layers of the SOA following a step of etching one or more epitaxial semiconductor layers.

SUMMARY OF THE INVENTION

According to an aspect of the invention, a polarization insensitive semiconductor optical amplifier (SOA) is provided. The SOA includes an active waveguide, a passive waveguide, and a taper coupler for coupling optical signal energy from the passive waveguide into the active waveguide. Most preferably, the taper coupler has width W varying relative to position along a main axis z of propagation of the SOA in proportion to the minimum value of $1/C_{TE\ 01}(z)$ and $1/C_{TM\ 01}(z)$, where $C_{TE\ 01}(z)$ represents the coupling coefficient between a fundamental mode and a first order mode for the transverse electric polarization at a position z along the main axis, and $C_{TM\ 01}(z)$ represents the coupling coefficient between a fundamental mode and a first order mode for the transverse magnetic polarization at that position z.

DETAILED DESCRIPTION

Figure 1:
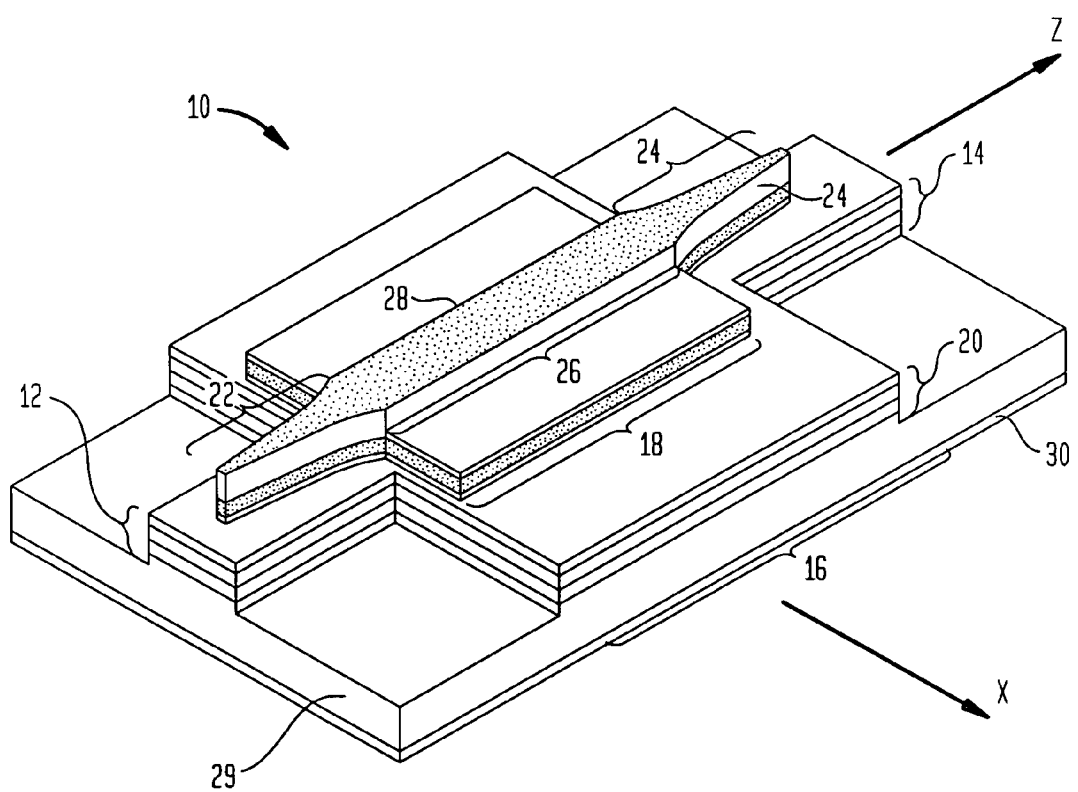
FIG. 1 is a perspective drawing illustrating a semiconductor optical amplifier according to an embodiment of the invention.
Figure 2:
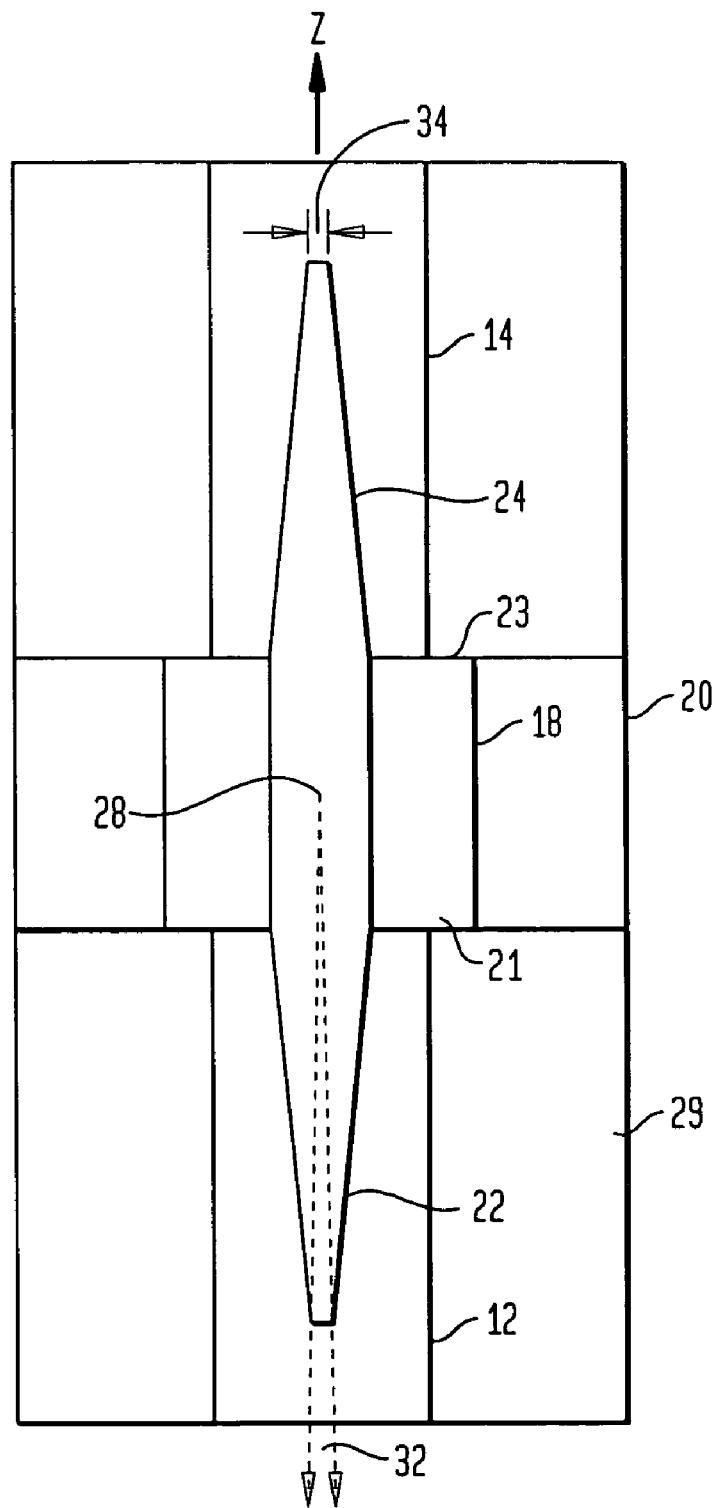
FIG. 2 is a top (plan) view illustrating a semiconductor optical amplifier according to an embodiment of the invention.

FIG. 1 illustrates the structure of a semiconductor optical amplifier (SOA) 10 according to an embodiment of the invention. FIG. 2 provides a plan view of the SOA 10. As illustrated in FIGS. 1 and 2, the SOA includes a pair of highly diluted fiber waveguides 12 and 14, one at each of an input end and an output end of the SOA, respectively. The diluted fiber waveguide (also referred to herein as "diluted waveguide" and "fiber waveguide") 12, functions to collect the optical energy from an optical transmission fiber and couple it into the SOA 10. The diluted fiber waveguide 14 transfers the optical energy from the SOA 10 into another optical transmission fiber. A diluted waveguide is a layered optical waveguide structure including a first set of layers each having a first index of refraction and a second set of layers each having a second index of refraction. In a diluted waveguide each layer of the first set of layers alternates with a layer of the second set of layers, resulting in a combined structure having an equivalent index of refraction that is between the indices of refraction of the first and the second sets of layers. The transmitted light is confined to the diluted waveguide because the equivalent index of refraction is higher than that of adjacent layers.

The diluted fiber waveguides 12 and 14 are coupled to a central active region 16 of the SOA 10, defined by an active waveguide 18 overlying a passive waveguide 20. The passive waveguide 20, in turn, is located over a region of n-type conductivity semiconductor 29. Such pairing of an active waveguide and a passive waveguide can be referred to as a "twin waveguide amplifier."

A pair of lateral taper couplers 22 and 24 are disposed at an input end and an output end of the SOA, respectively. Lateral taper coupler 22 is adapted to transfer energy at an input end of the SOA 10 from the diluted waveguide 12 and passive waveguide 20 up into the active waveguide 18 prior to amplification. Lateral taper coupler 24 is adapted to transfer energy at an output end of the SOA 10 from the active waveguide 18 back into the passive waveguide 20 and diluted waveguide 14.

In a preferred embodiment, the SOA 10 is symmetric about a longitudinal axis z and also about a lateral axis x. In such embodiment, the optical signal can be input to the SOA 10 through the diluted waveguide 12 and taper coupler 22 and then output through the taper coupler 24 and diluted waveguide 14. Alternatively, the optical signal can be input to the SOA 10 through the diluted waveguide 14 and taper coupler 24 and then output through the taper coupler 22 and diluted waveguide 12.

As also shown in FIG. 1, the SOA 10 includes a ridge 26 located between the two lateral taper couplers 22 and 24. The ridge 26 is located above the part of the active waveguide 18 in which the propagating mode is essentially confined. Metal contacts 28 and 30 are provided to the p-type and n-type regions of the SOA 10, the contacts 28 and 30 being located at the top and bottom of the structure, respectively.

As shown in FIG. 2, the SOA 10 is tilted at an angle 32 with respect to the longitudinal axis z. The tilt angle 32 preferably measures 7 degrees. The tilt angle 32 is provided to avoid coupling of optical noise into the ends of the taper couplers 22, 24. Such optical noise can be generated, for example, at the end of the optical transmission fiber as scattered light that escapes being transferred to the diluted waveguide 12. The tilt angle also avoids optical signal energy emitted from a taper coupler 22 or 24 from reentering the taper coupler 24 as noise due to reflection off of other elements.

As also shown in FIG. 2, the lateral taper couplers 22 and 24 are fabricated to a minimum width 34. The minimum width is selected to be not less than the minimum lithographic feature size F, for example 1 μm, for the available lithography process. The photolithography process is preferably a photolithography process employing a contact mask. The lateral taper couplers 22, 24, as well as all other parts of the SOA 10 can be patterned by photolithography using contact masks which tends to be less costly than other alternatives. After creating photoresist patterns using contact photolithography, anisotropic, vertical etching is used to define the sidewalls and depth of taper couplers 22, 24, and the ridge 26. Thereafter, further patterning and etching are performed to define the active waveguide 18. Still further patterning and etching are performed to define the fiber waveguides 12, 14 and passive waveguide 20.

Figure 3:
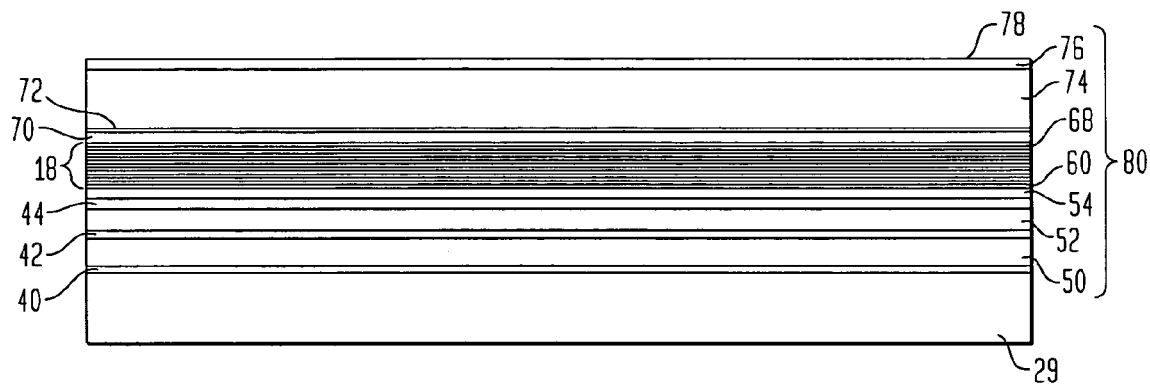
FIG. 3 is a cross-sectional diagram illustrating a material layer structure of a semiconductor optical amplifier according to an embodiment of the invention.
Figure 4:
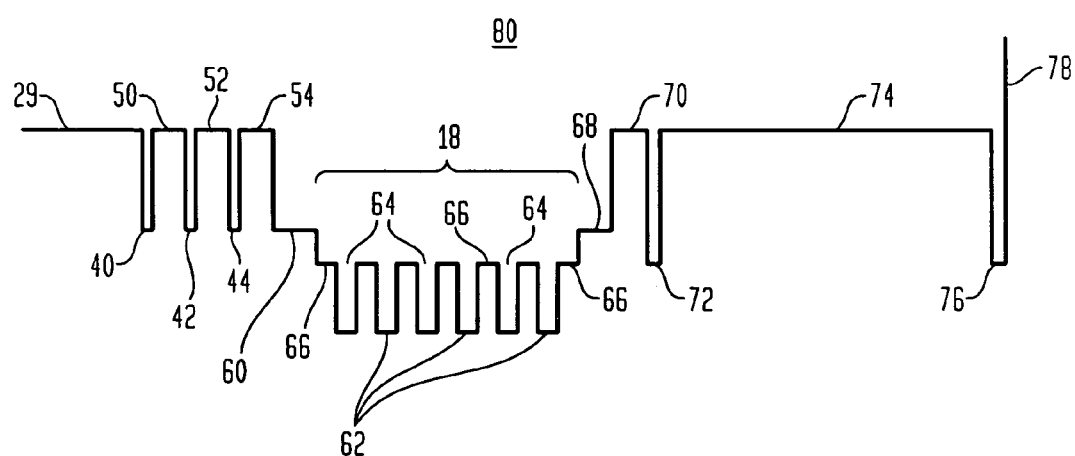
FIG. 4 is a bandgap diagram illustrating a material layer structure of a semiconductor optical amplifier according to an embodiment of the invention.

FIG. 3 is a cross-sectional view illustrating the material layer structure 80 of the SOA 10 prior to etching the same to form the respective taper couplers, ridge, active waveguide, passive waveguide and fiber waveguide portions of the SOA 10. The material layer structure 80 is a monolithic multilayer semiconductor structure from which the portions of the SOA 10 are defined by etching. FIG. 4 is a bandgap diagram illustrating the bandgap energy levels of the various layers of the SOA shown in FIG. 3. The material layer structure of SOA 10 is described next, with reference to FIGS. 3 and 4.

The material layer structure 80 of the SOA is achieved by growing epitaxial layers having controlled semiconductor compositions and controlled dopant concentrations, preferably by a molecular beam epitaxy process. Alternatively, the epitaxial growth of the layers can be achieved through any of several known processes including various alternative forms of vapor deposition processes such as various types of chemical vapor deposition processes. The resulting material layer structure provides the layers from which a passive waveguide, active waveguide formed thereabove, first and second taper couplers, and first and second fiber waveguides are formed at respective ends thereof by etching the layers according to mask patterns.

The fiber waveguides 12, 14 are highly diluted optical waveguides. The passive waveguide 20 in the central portion 16 of the SOA 10 has the same material layer structure as the fiber waveguides 12 and 14. The fiber waveguides 12, 14 and the passive waveguide 20 transmit the energy of the propagating mode of the optical signal along a main axis z of propagation. The propagating mode is confined laterally in an x-axis direction, and vertically in a y-axis direction by the fiber waveguides 12, 14 and the passive waveguide 20.

The material layer structure 80 includes a series of epitaxially grown semiconductor layers overlying an n-type conductivity substrate 29. The semiconductors that make up the layers of the structure 80 are preferably III-V semiconductors, i.e., materials according to the stoichiometric formula $Al_a In_b Ga_c N_x As_y P_z$ where (a+b+c) is about 1 and (x+y+z) is also about 1. Included among at least some of the layers of the structure are phosphide semiconductors. Phosphide semiconductors are III-V semiconductors in which z is 0.5 or more, most typically about 0.8 or more.

The diluted waveguide structure of the fiber waveguides 12, 14 and the passive waveguide 20 therebetween includes a plurality of thin layers having a high index of refraction (hereinafter "high index" layers), e.g. three layers 40, 42, 44, that are interleaved with a plurality of thicker layers 50, 52, 54, having a relatively low index of refraction (hereinafter, "low index" layers). This results in the fiber waveguides 12, 14 and passive waveguide 20 each having an equivalent index of refraction that is between the lower and the higher indices of refraction of the layers that make up these features.

In an exemplary embodiment, the high index layers include a quaternary semiconductor material (InGaAsP) having a bandgap wavelength of about 1.2 μm that is doped n-type to a concentration of about $1\times10^{18}$ cm$^{-3}$. Such quaternary layers 40, 42, 44 desirably have a thickness of about one third the thickness of the low index layers 50, 52, 54, the low index layers being desirably made of a binary InP material, also doped n-type to a concentration of about $1\times10^{18}$ cm$^{-3}$.

A first separate confinement layer 60 is located above the uppermost low index layer 54 of the layers 40-54 that make up the fiber waveguide and passive waveguide structures. Like the other layers of the material layer structure 80, the separate confinement layer 60 is co-planar with the main axis of propagation z within the SOA 10. The separate confinement layer 60 operates to transfer optical signal energy in a direction from the passive waveguide 20 into the active waveguide 18, while confining the energy in the active waveguide 18 so that it is not easily transferred back into the passive waveguide 20. The separate confinement layer 60 is preferably formed of a quaternary material such as InGaAsP that is lattice-matched to the adjacent layer 54 of binary InP material of the passive waveguide 20.

Preferably, the separate confinement layer 60 is grown epitaxially while shutting off the supply of a dopant source to the chamber during its growth, such that the amount of a dopant within the separate confinement layer 60 is consistent with not intentionally doping such layer 60. Preferably, the separate confinement layer 60 has a bandgap wavelength of about 1.05 μm.

A second separate confinement layer 68 formed in a manner such as that described for the first separate confinement layer 60 is provided above the active waveguide 18, acting to confine optical signal energy to the active waveguide 18 while permitting one-way transfer of signal energy from one or more layers above the active waveguide 18 into the active waveguide 18. Like the other layers of the material layer structure 80, the separate confinement layer 68 is co-planar with the main axis of propagation z within the SOA 10. Preferably, the separate confinement layer 68 has a bandgap wavelength of about 1.05 μm.

The structure of the active waveguide 18 will now be described. Referring to FIGS. 3 and 4, the active waveguide 18 includes multiple quantum wells (MQWs). The MQWs include a plurality of wells 62 having a crystal structure that is under tensile strain (hereinafter, "tensile wells"). The tensile wells 62 are interleaved with a plurality of wells 64 having a crystal structure that is under compressive strain (hereinafter, "compressive wells"). The combination of the tensile wells 62 interleaved with the compressive wells 64 enable the active waveguide 18 portion of the SOA 10 to operate in a polarization insensitive manner.

A barrier layer 66 is provided between each tensile well 62 and the adjacent compressive well 64. Another barrier layer 66 is disposed between the lowermost well 64 and the first separate confinement layer 60. Yet another barrier layer 66 is disposed between the uppermost well 64 and the second separate confinement layer 68. Each barrier layer 66 preferably consists of a quaternary material such as InGaAsP.

The tensile wells 62 and the compressive wells 64 each desirably have a bandgap wavelength of 1.55 μm, the preferred transmission frequency of the optical signal. Optical signal energy at 1.55 μm is therefore amplified to a greater extent than at any other wavelength. By contrast, the bandgap wavelength of each barrier layer 66 is preferably 1.2 μm. Preferably, the multiple interleaved quantum wells alternate between a compressive well 64 having a strain of about +1% and a tensile well 62 having a strain of about −0.8%.

A low index layer 70 of a binary material such as InP is provided above the second separate confinement layer 68. The low index layer 70 is provided of a p-type conductivity material. Layer 70 is grown in a chamber while turning off dopant sources during most of the growth of layer 70. The dopant source is turned on again while growing the last half portion or less of the layer 70 to provide a p-type dopant concentration of between $1 \times 10^{17}$ cm$^{-3}$ and $3 \times 10^{17}$ cm$^{-3}$. More preferably, the dopant source is turned off during growth of the first two thirds of the thickness of layer 70, and the dopant source is turned on again only during growth of the final one third of the thickness of the layer 70.

Just above the low index layer 70, another layer 72 is grown for the purpose of providing an etch stop layer 72. The etch stop layer 72 is preferably formed of a quaternary material such as InGaAsP having p-type conductivity at a dopant concentration of $3 \times 10^{17}$ cm$^{-3}$, and having a bandgap wavelength of 1.2 μm. The etch stop layer 72 provides a distinguishable layer at which an etch process subsequent to the growth of the material layer structure 80 can be halted, such as an etch which defines the top surface of the active waveguide 18. For example, etching can be halted at the etch stop layer 72 as a result of etching selective to the material of the etch stop layer 72. In another example, etching can be halted upon reaching the etch stop layer 72 and detecting the release of a chemical therefrom.

A cladding layer 74 is provided above the etch stop layer 72, the thickness of which is desirably large in relation to the thickness of the layers that underlie the cladding layer 74. The cladding layer 74 is doped p-type to a concentration between $3 \times 10^{17}$ cm$^{-3}$ and $1 \times 10^{18}$ cm$^{-3}$ and is preferably composed of a binary material such as InP. Finally, a contact 76 of p-type conductivity is provided of a quaternary semiconductor such as InGaAsP, the contact 76 preferably being doped more heavily than the cladding layer 74 to a concentration of $1 \times 10^{18}$ cm$^{-3}$ to $4 \times 10^{18}$ cm$^{-3}$. The upper surface of the SOA 10 is defined by the surface 78 of the p-type contact 76.

All of the above-described layers 40 through 76 of the SOA 10 are desirably formed by epitaxial growth in a single chamber of a molecular beam epitaxy tool or a suitable tool for performing any one of several known vapor deposition processes. In such manner, the layers 40 through 76 of the material layer structure 80 are grown, layer upon layer upon a substrate 29, preferably a substrate of n-type conductivity. Thereafter, the material layer structure 80 is etched to define the shape and dimensions of the SOA structure 10 that is illustrated in FIGS. 1 and 2.

Polarization insensitivity and high transfer efficiency are achieved by characteristics of the material layer structure 80 and shape of the fiber waveguides 12, 14 and the lateral taper couplers 22, 24 of the SOA 10. In order to achieve high transfer efficiency from an optical transmission fiber to the fiber waveguide 12 of the SOA 10, the fiber is provided with a lens for focusing the optical signal energy into the fiber waveguide 12 and the fiber waveguide 12 receives the optical signal energy with little coupling loss. By the particular material layer structure 80 and shape of the SOA 10, it is possible to achieve a coupling loss between the transmission fiber and the SOA 10 of as little as 1 dB. As will be described in more detail below, polarization insensitivity is achieved because the fiber waveguide, taper couplers and active waveguide therebetween minimize the coupling of optical signal energy between the fundamental mode and first order mode for each of the transverse electric (TE) polarization and transverse magnetic (TM) polarization of the optical signal.

The particular characteristics of an active waveguide 18 which provide polarization insensitive amplification have already been described. The characteristics of the polarization insensitive lateral taper couplers 22 and 24 of the SOA 10 will now be described. Here, it will be helpful to first highlight some general concepts regarding taper couplers and equations regarding the coupling of energy between propagating modes of light.

First, a taper coupler should be designed to operate adiabatically, i.e., such that during the transfer of energy from fiber waveguide and passive waveguide through the taper coupler into the active waveguide, the optical signal propagates in a fundamental local mode, with negligible coupling to other modes. The degree of coupling between different modes is modeled by the following equation:

$$C_{ij}(z) = \frac{k_0}{4}\left(\frac{\varepsilon_0}{\mu_0}\right)^{\frac{1}{2}} \frac{1}{\beta_i(z) - \beta_j(z)} \iint_A E_i^* \cdot E_j \frac{\partial n^2(x, y, z)}{\partial z} dx dy \quad (1)$$

where $C_{ij}$ is the coupling coefficient between modes i and j, $\beta_i$ and $\beta_j$; the propagation constants of the modes i and j, and $E_i$ and $E_j$, the optical fields of the modes i and j.

The following design rule (2) relates the coupling coefficient $C_{ij}$ for the fundamental mode (i=0) and the first order mode (j=1) to the change in the width W of the taper coupler with respect to the longitudinal axis z as follows:

$$\frac{dw}{dz} \propto \frac{1}{C_{ij}(z)} \quad i, j = 0, 1 \tag{2}$$

The coupling coefficients for each point along the longitudinal axis z of the taper coupler can be determined by equation (1) above. Design rule (2) demonstrates that the variation in the width W of the taper coupler along the longitudinal axis (z) of the taper coupler should be small where coupling is strong, i.e., where coupling coefficients from equation (1) are large, in order to minimize the coupling of optical signal power to unwanted modes. On the other hand, where the degree of coupling is weak, i.e., where coupling coefficients are small, the rate of variation in the width of the taper coupler can be made larger. Only coupling between the zeroth order (fundamental) mode and the first order mode need be considered in the above equation (2), since coupling is strongest between the fundamental mode and the first order mode and comparatively weak for other modes. However, design rule (2) does not indicate the conditions under which polarization insensitive coupling can be achieved.

The inventors have found that polarization insensitive coupling is achieved in a taper coupler in which the width W varies at a rate with respect to position along the longitudinal axis z according to the relation:

$$\frac{dw}{dz} \propto \min\left\{\frac{1}{C_{TE,ij}(z)}, \frac{1}{C_{TM,ij}(z)}\right\} \quad i, j = 0, 1 \tag{3}$$

where $C_{TE, ij}(z)$ is the coupling coefficient for the transverse electric (TE) polarization between the fundamental mode 0 (i=0) and the first order mode (j=1), and $C_{TM, ij}(z)$ is the coupling coefficient for the transverse magnetic (TM) polarization between the fundamental mode (i=0) and the first order mode (j=1).

The above relation (3) determines the contours of the polarization insensitive taper couplers 22, 24 relative to the z axis as a function of the coupling coefficients at each position of the taper couplers along the z axis. As a result, taper couplers are provided that are generally other than linear or exponential in shape.

As described above, in order to provide taper couplers 22, 24 that operate adiabatically, the coupling of signal power from the fundamental mode to other modes should be minimized. To minimize coupling between the fundamental mode and other modes for both TE and TM polarizations, the rate of variation of the taper width to the position should be determined by the larger of the coupling coefficients for the TE and TM polarizations.

The taper couplers 22, 24 preferably have a minimum width of 1 μm, as determined by the minimum feature size of the preferred contact photolithography method. The maximum width of the taper couplers is determined by the desired width of the ridge 26 of the SOA 10. With the minimum and maximum widths and the shape of the lateral taper couplers so specified, the contour of the taper couplers is thus fully determined. Polarization insensitive taper couplers are provided in such manner for use together with the polarization insensitive active waveguide 18 to provide a polarization insensitive SOA 10.

Figure 5:
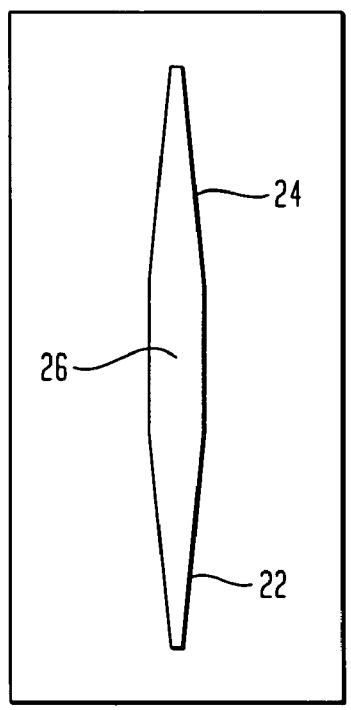
FIGS. 5 and 6 are plan views illustrating stages in the fabrication of a semiconductor optical amplifier according to an embodiment of the invention.
Figure 6:
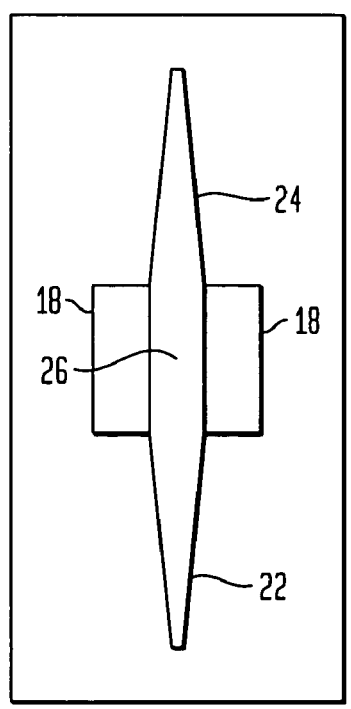

FIGS. 5 and 6 are top (plan) views illustrating intermediate stages in processing the layered structure shown in FIG. 3 to obtain the SOA 10 that is illustrated in FIGS. 1 and 2. As shown in FIG. 5, in a first etch step, the first and second taper couplers 22, 24 and the ridge 26 therebetween are defined by etching through layers 76 and 74 of the layered structure 80 (FIG. 3), in all areas except where the taper structures 22, 24 and ridge 26 are to remain. This etch process stops at the etch stop layer 72. This etch step can be accomplished, for example, through use of a patterned etch-resistant mask layer overlying the portions 22, 24, 26 of the layered structure 80, such mask layer being provided, for example, as a patterned photoresist or patterned oxide or nitride hardmask layer. Since this etch step defines the shape of the taper coupler portions 22, 24 and the ridge 26, it is at this step that the overlying mask pattern is first provided according to the shape given by equation (3) above.

Thereafter, as shown in FIG. 6, the active waveguide 18 of the SOA 10 is defined by another etch step in which the active waveguide 18 portion of the layered structure 80 is now protected from being etched by a mask pattern, as well as the taper coupler and ridge areas 22, 24, and 26 which remain protected. During this etch, all areas of the layered structure 80 outside of the active waveguide 18 and the taper couplers 22, 24 are etched from layer 72 down to the top of layer 54 (FIGS. 3-4).

Next, with reference to FIG. 2, the layered structure 80 is etched a third time to provide the SOA 10 structure illustrated in FIG. 2. This third etch is performed through the interleaved layers 54 through 50 and 44 through 44, while protecting the taper couplers 22, 24, ridge 26, and the active waveguide 18, to define the dimensions of the fiber waveguides 12, 14 and the passive waveguide 20 of the SOA 10.

After this series of etch steps have been performed, cleaving is performed to provide facets 21 and 23. This can be performed, for example, by creating a small vertically extending fracture in the layered semiconductor crystal structure 80, which then propagates in the vertical direction y and in the horizontal direction x transverse to the longitudinal z axis to create the facets 21 and 23. The facets are desirably coated thereafter with an anti-reflective coating to help prevent light from the transmission fibers coupled thereto from being reflected off of the facets 21, 23. Such reflected light could add to the noise within the SOA 10 by reverberating within a package housing the SOA 10 and thereafter being coupled into the SOA 10.

The SOA 10 described in the foregoing need not be provided merely as a standalone component. Other types of photonic integrated circuits (PICs) such as a high-speed p-i-n photodiode of an optical receiver, an optoelectronic modulator, or optoelectronic transmitter can be fabricated as a low coupling loss, polarization insensitive device according to the principles of the invention. In each case, a series of epitaxial layers is grown to form a material layer structure 80 or structure similar thereto. The material layer structure is then etched to provide a first waveguide, a second waveguide and one or more taper couplers having the characteristics described above. Those skilled in the art will understand the modifications which can be made to the above-described process of forming a SOA 10 in order to provide such p-i-n photodiode receiver, optoelectronic modulator and/or transmitter.

As these and other variations and combinations of the features discussed above can be utilized, the foregoing description of the preferred embodiments should be taken by way of illustration, rather than by limitation of the invention, as defined by the claims appended below.

The invention claimed is:

1. A polarization insensitive semiconductor optical amplifier (SOA), comprising an active waveguide, a passive waveguide, and a taper coupler for coupling optical signal energy from said passive waveguide into said active waveguide, said taper coupler having width W in a lateral x direction transverse to a z direction of a main axis of propagation of said SOA, said width W varying relative to position in said z direction, wherein a rate of variation (dw/dz) of said width W relative to the position in said z direction is in proportion to the minimum value of $1/C_{TE\ 01}(z)$ and $1/C_{TM\ 01}(z)$, where $C_{TE\ 01}(z)$ represents the coupling coefficient between a fundamental mode and a first order mode for the transverse electric polarization at a position along the main axis, and $C_{TM\ 01}(z)$ represents the coupling coefficient between a fundamental mode and a first order mode for the transverse magnetic polarization at that position.

2. The semiconductor optical amplifier of claim 1 further comprising a separate confinement layer between said passive waveguide and said active waveguide.

3. The semiconductor optical amplifier of claim 2 wherein said separate confinement layer includes an epitaxially grown semiconductor that is not intentionally doped.

4. The semiconductor optical amplifier of claim 3 wherein said separate confinement layer includes a layer of Indium-Gallium-Arsenide-Phosphide (InGaAsP) having a bandgap wavelength of 1.05 µm.

5. The semiconductor optical amplifier of claim 1 wherein said taper coupler has minimum width no smaller than a minimum lithographic feature size of a contact lithography process for making said semiconductor optical amplifier.

6. The semiconductor optical amplifier of claim 5 wherein a width of said taper coupler is at least 1 µm at a smallest point.

7. The semiconductor optical amplifier of claim 1 wherein said taper coupler and said passive waveguide are separated by a separate confinement layer disposed in a plane parallel to a main axis of propagation of light within said semiconductor optical amplifier.

8. The semiconductor optical amplifier of claim 1 wherein said passive waveguide comprises a diluted fiber waveguide for coupling optical energy in a direction of at least one of to an optical transmission fiber and from an optical transmission fiber.

9. The semiconductor optical amplifier as claimed in claim 1 wherein an axial direction of the taper coupler lies within a plane defined by said x direction and z direction and is oriented at an angle away from said z direction and away from said x direction.

10. The semiconductor optical amplifier as claimed in claim 9 wherein the angle is seven degrees away from said z direction.

11. A polarization insensitive semiconductor optical amplifier (SOA), comprising an active waveguide, a passive waveguide, and a taper coupler for coupling optical signal energy from said passive waveguide into said active waveguide, said taper coupler having width W in a lateral x direction transverse to a z direction of a main axis of propagation of said SOA, said width W varying relative to position in said z direction, wherein said active waveguide includes a plurality of first quantum wells interleaved with a plurality of second quantum wells, said first quantum wells having tensile strain and said second quantum wells having compressive strain.

12. A polarization insensitive optical unit comprising a first waveguide and a second waveguide having a common direction of propagation (z), and a taper coupler for coupling optical signal energy from said first waveguide into said second waveguide, said taper coupler having width W in a lateral x direction transverse to said z direction, said width W varying relative to position in said z direction, wherein a rate of variation (dw/dz) of said width W relative to the position in said z direction is in proportion to the minimum value of $1/C_{TE\ 01}(z)$ and $1/C_{TM\ 01}(z)$ where $C_{TE\ 01}(z)$ represents the coupling coefficient between a fundamental mode and a first order mode for a light wave having transverse electric polarization at a position along the main axis, and $C_{TE\ 01}(z)$ represents the coupling coefficient between a fundamental mode and a first order mode for the transverse magnetic polarization at that positions.

13. The optical unit as claimed in claim 12 wherein said first and second waveguides and said taper coupler consist entirely of portions of a monolithic multilayer structure.

14. The optical unit as claimed in claim 13 wherein said multilayer structure includes semiconductor materials.

15. The optical unit as claimed in claim 14 wherein said semiconductor materials are selected from the group consisting of III-V semiconductors.

16. The optical unit as claimed in claim 15 wherein said semiconductor materials are selected from the group consisting of phosphide semiconductors.

17. The optical unit as claimed in claim 12 wherein at least one of said first waveguide and said second waveguide includes an optoelectronic receiver.

18. The optical unit as claimed in claim 12 wherein at least one of said first waveguide and said second waveguide includes a p-i-n photodiode receiver.

19. The optical unit as claimed in claim 12 wherein at least one of said first waveguide and said second waveguide includes a photodiode.

20. The optical unit as claimed in claim 12 wherein at least one of said first waveguide and said second waveguide includes an optoelectronic modulator.

21. The optical unit as claimed in claim 12 wherein at least one of said first waveguide and said second waveguide includes an optoelectronic transmitter.

22. The optical unit as claimed in claim 12 wherein an axial direction of the taper coupler lies within a plane defined by said x direction and z direction and is oriented at an angle away from said z direction and away from said x direction.

23. The optical unit as claimed in claim 22 wherein the angle is seven degrees away from said z direction.

24. A polarization insensitive lateral taper coupler operable to couple optical signal energy from a first waveguide into a second waveguide, the first waveguide and the second waveguide having a common direction of propagation (z), said taper coupler having width W in a lateral x direction transverse to said z direction, said width W varying relative to position in said z direction, wherein a rate of variation (dw/dz) of said width W relative to the position in said z direction is in proportion to the minimum value of $1/C_{TE\ 01}(z)$ and $1/C_{TM\ 01}(z)$ where $C_{TE\ 01}(z)$ represents the coupling coefficient between a fundamental mode and a first order mode for a light wave having transverse electric polarization at a position along the main axis, and $C_{TM\ 01}(z)$ represents the coupling coefficient between a fundamental mode and a first order mode for the transverse magnetic polarization at that positions.

25. The lateral taper coupler as claimed in claim 24 wherein said lateral taper coupler consists entirely of portions of a monolithic multilayer structure.

26. The lateral taper coupler as claimed in claim 25 wherein said multilayer structure includes semiconductor materials.

27. The lateral taper coupler as claimed in claim 26 wherein said semiconductor materials are selected from the group consisting of III-V semiconductors.

28. The lateral taper coupler as claimed in claim 27 wherein said semiconductor materials are selected from the group consisting of phosphide semiconductors.

29. The lateral taper coupler as claimed in claim 24 wherein said width w of said lateral taper coupler in said lateral direction x is no smaller than a minimum lithographic feature size of a contact lithography process for making said lateral taper coupler.

30. The lateral taper coupler as claimed in claim 29 wherein said lateral taper coupler is etched to a width no smaller than 1 μm at a smallest point.

31. The lateral taper coupler as claimed in claim 24 wherein an axial direction of the taper coupler lies within a plane defined by said x direction and z direction and is oriented at an angle away from said z direction and away from said x direction.

32. The lateral taper coupler as claimed in claim 31 wherein the angle is seven degrees away from said z direction.

* * * * *

UNITED STATES PATENT AND TRADEMARK OFFICE
CERTIFICATE OF CORRECTION

PATENT NO. : 7,373,048 B2
APPLICATION NO. : 11/062095
DATED : May 13, 2008
INVENTOR(S) : Fengnian Xia and Stephen Forrest It is certified that error appears in the above-identified patent and that said Letters Patent is hereby corrected as shown below:

Col. 1, line 5 insert the following

--GOVERNMENT RIGHTS

This invention was made with Government support under Contract No. DAAD17-02-C-0099 awarded by the Defense Advanced Research Projects Agency (DARPA). The government has certain rights in this invention.--

Column 10, line 12 "$C_{TE}$" should read -- $C_{TM}$ --.
Column 10, line 14 "positions" should read --position--.
Column 10, line 64 "positions" should read --position--.

Signed and Sealed this

Thirteenth Day of January, 2009

JON W. DUDAS
*Director of the United States Patent and Trademark Office*